US008101434B2

(12) United States Patent

Guillien et al.

(10) Patent No.: US 8,101,434 B2
(45) Date of Patent: Jan. 24, 2012

(54) METHOD FOR LED-MODULE ASSEMBLY

(75) Inventors: Wayne Guillien, Franksville, WI (US); Scot Siebers, Racine, WI (US); Joel Kapellusch, Racine, WI (US); Kurt S. Wilcox, Libertyville, IL (US)

(73) Assignee: Ruud Lighting, Inc., Racine, WI (US)

( * ) Notice: Subject to any disclaimer, the term of this patent is extended or adjusted under 35 U.S.C. 154(b) by 85 days.

(21) Appl. No.: 12/473,017

(22) Filed: May 27, 2009

(65) Prior Publication Data

US 2009/0298376 A1 Dec. 3, 2009

Related U.S. Application Data

(60) Provisional application No. 61/056,412, filed on May 27, 2008.

(51) Int. Cl.
*G01R 31/26* (2006.01)

(52) U.S. Cl. ..................... 438/15; 438/26; 257/E21.499

(58) Field of Classification Search .................... 438/15, 438/26; 257/E21.499
See application file for complete search history.

(56) References Cited

U.S. PATENT DOCUMENTS

| | | | |
|---|---|---|---|
| 5,617,131 | A | 4/1997 | Murano et al. |
| 6,641,284 | B2 | 11/2003 | Stopa et al. |
| 6,846,093 | B2 | 1/2005 | Swaris et al. |
| 7,319,498 | B2 | 1/2008 | Sakurai et al. |
| 7,325,949 | B1 | 2/2008 | Wang |
| 7,329,030 | B1 | 2/2008 | Wang |
| 7,374,306 | B2 | 5/2008 | Liu |
| 2002/0062170 | A1 | 5/2002 | Skunes et al. |
| 2006/0022214 | A1 | 2/2006 | Morgan et al. |
| 2008/0080162 | A1 | 4/2008 | Wilcox et al. |
| 2008/0080196 | A1 | 4/2008 | Ruud et al. |

OTHER PUBLICATIONS

Excerpts of International Search Report and Written Opinion for PCT/US09/03224. Date: Jul. 24, 2009. 4 pages.

*Primary Examiner* — Matthew Reames
(74) *Attorney, Agent, or Firm* — Jansson Shupe & Munger Ltd.

(57) ABSTRACT

A method for LED-module assembly comprising the steps of providing a base portion with a base inner surface and a cover with a cover inner surface which together define a module interior, the cover having at least one opening therethrough; putting a sealing member into the module interior; positioning an LED lens into the cover opening; aligning an LED emitter and the LED lens within the module interior; sealing the module interior by securing the base portion with respect to the cover. The LED emitter is powered for imaging of the LED module to test light-output characteristics. A specific type of the LED lens is selected and its type and orientation are verified. The step of vacuum testing checks for water-air/tightness of the sealing of LED-module interior. A central database provides assembly and testing parameters to automated tool(s) performing each particular step. Each LED module includes a unique machine-identifiable module-marking with which the data related to each individual LED module is associated and stored in the central database.

24 Claims, 5 Drawing Sheets

METHOD FOR LED-MODULE ASSEMBLY

RELATED APPLICATION

This application is based in part on U.S. Provisional Application Ser. No. 61/056,412, filed May 27, 2008, the contents of which are incorporated herein by reference.

FIELD OF THE INVENTION

This invention relates to lighting fixtures and, more particularly, to methods of assembling lighting fixtures using LED emitters.

BACKGROUND OF THE INVENTION

In recent years, the use of light-emitting diodes (LEDs) for various common lighting purposes has increased, and this trend has accelerated as advances have been made in LEDs and in LED-array bearing devices, often referred to as "LED modules." Indeed, lighting applications which have been served by fixtures using high-intensity discharge (HID) lamps and other light sources are now increasingly beginning to be served by LED modules. Such lighting applications include, among a good many others, roadway lighting, parking lot lighting and factory lighting. Creative work continues on development of lighting fixtures utilizing led modules. It is the latter field to which this invention relates.

High-luminance light fixtures using LED modules as light source present particularly challenging problems. High costs due to high complexity becomes a particularly difficult problem when high luminance, reliability, and durability are essential to product success. Keeping LEDs and LED-supporting electronics in a water/air-tight environment may also be problematic, particularly when, as with roadway lights and the like, the light fixtures are constantly exposed to the elements. Use of a plurality of LED modules presents further challenges.

Yet another cost-related challenge is the problem of achieving a high level of adaptability in order to meet a wide variety of different luminance requirements. That is, providing a fixture which can be adapted to give significantly greater or lesser amounts of luminance as deemed appropriate for particular applications is a difficult problem. Light-fixture adaptability is an important goal for LED light fixtures.

Dealing with heat dissipation requirements is still another problem area for high-luminance LED light fixtures. Heat dissipation is difficult in part because high-luminance LED light fixtures typically have a great many LEDs and several LED modules. Complex structures for module mounting and heat dissipation have sometimes been deemed necessary, and all of this adds to complexity and cost.

In short, there is a significant need in the lighting industry for an improvement in manufacturing lighting fixtures using LEDs, addressing the problems and concerns referred to above.

OBJECTS OF THE INVENTION

It is an object of the invention to provide an improved method for assembly of LED modules for use in lighting fixtures, such improved method overcoming some of the problems and shortcomings of the prior art, including those referred to above.

Another object of the invention is to provide an improved method for validation of an assembled module to satisfy necessary requirements.

How these and other objects are accomplished will become apparent from the following description and the drawings.

SUMMARY OF THE INVENTION

A method of assembly and validation of an LED module is disclosed. The method includes the steps of providing a base portion with a base inner surface and a cover with a cover inner surface which together define a module interior, the cover having at least one opening therethrough; putting a sealing member into the module interior, positioning into the cover opening a specific type of an LED lens designed for a desired distribution of the emitter light. The type of the LED lens is preferably verified. An LED emitter is placed into the module interior such that the emitter is aligned with the LED lens. The module interior is sealed by securing the base portion with respect to the cover thereby completing the LED module. In preferred embodiments, the base portion includes a heat sink for heat-dissipation from the LED emitter during operation.

The term "LED emitter," as used herein, refers to an LED light source that may be in a form of an "LED package,"—a term known in the industry, or any other form providing LED-emitted light. Some examples of LED packages have one or multiple number of light-emitting diodes. Such multiple diodes may emit light with the same wave length which produce a common-color light. Alternatively, multiple diodes may emit light of different waive lengths thus of different colors which may be blended to achieve a desired-color light. Persons skilled in the art would appreciate a broad variety of available LED emitters. As is known, LED "packages," with a single LED (or small LED cluster) may include a "primary lens." Typically, the primary lens has an illumination pattern which is substantially rotationally symmetric around the emitter axis, and the primary lens itself is typically substantially hemispherical. When an LED lens, which is designed for a desired illumination, is positioned over an LED package with the primary lens, such LED lens is sometimes referred to as a "secondary" lens. It should be understood that the term "secondary lens" is used only for clarity of the current disclosure and in no way limiting this invention to the use of LED packages with primary lenses.

When the LED module is fully assembled, a power is provided to the LED emitter. An image of the powered LED module is then taken to test light-output characteristics. In preferred embodiments, the image of the LED module is utilized to test intensity, light distribution and color temperature of the LED emitter(s).

In preferred embodiments, the cover includes a plurality of openings. A specific type of the LED lens is placed into each opening. The aligning step includes a plurality of LED emitters on a mounting board, each emitter being aligned with its corresponding LED lens. A specific type of the LED lens is positioned into each of the openings.

The steps of positioning a specific type of the LED lens and verifying the type of such LED lens are preferably performed by a robot which incorporates a vision system. It is further preferred that the secondary LED lens includes a machine-identifiable lens-indicia. In such embodiments, the steps of verifying the type and orientation of the secondary LED lens are accomplished by the vision system reading the machine-identifiable lens-indicia.

In highly preferred embodiments, after the base portion has been installed over the cover, the method further includes the step of vacuum testing of the LED module for water/air-tight seal between the cover and the base portion.

In some preferred versions of the LED modules, the cover includes a plurality of screw holes. In assembly of such LED-module versions, prior to the step of vacuum testing, the method includes the steps of inserting a screw into all but one of the plurality of screw holes. The cover preferably also includes a power connection which may be in various forms such as an electrical connector or a wireway opening. When the power connection is in the form of the wireway opening, such wireway opening is sealed prior to the step of vacuum testing. The vacuum-testing step preferably utilizes the screw hole without a screw therein as an access point for the vacuum testing. It is highly preferred that the screws are inserted by using an automated screwdriver capable of controlling the torque utilized during the screw insertion for controlled pressure applied between the cover and the base portion.

In any of the described embodiments, it is preferred that the method further includes the step of providing a central database, whereby the central database provides assembly and testing parameters. It is also preferred that the method of the present invention is performed by an automated system receiving instructions from the central database for each particular step preformed by automated tool(s). The central database collects and stores data related to all or at least one of: the LED emitter and LED lens type, selection and orientation of the LED lens, screw torque, vacuum testing parameters, light output and color testing procedures.

It is further preferred that the LED module includes a unique machine-identifiable module-marking. Such machine-identifiable marking can be in any suitable form. Some examples of such marking may include a text, a set of symbols, a bar code or a combination of these marking types. The steps of the inventive method are preferably repeated multiple times to create a plurality of LED modules. The method preferably includes a further step of reading the unique machine-identifiable module-marking. The data of each unique machine-identifiable module-marking is associated with a specific individual LED module. Such date relates to that LED module's LED emitter(s), the type of the LED lens(s) such as selection and orientation of the LED lens(s), as well as light-output and color-testing procedures.

The term "base portion," while it might be taken as indicating a lower position with respect to the direction of gravity, should not be limited to a meaning dictated by the direction of gravity.

The presently-described method applies to LED modules generally. However, the inventive method is particularly useful in the construction of LED modules described in U.S. patent application Ser. No. 11/743,961, filed on May 3, 2007, and Ser. No. 11/774,422, filed on Jul. 6, 2007, the contents of which are incorporated herein by reference.

DETAILED DESCRIPTION OF PREFERRED EMBODIMENTS

Figure 1:
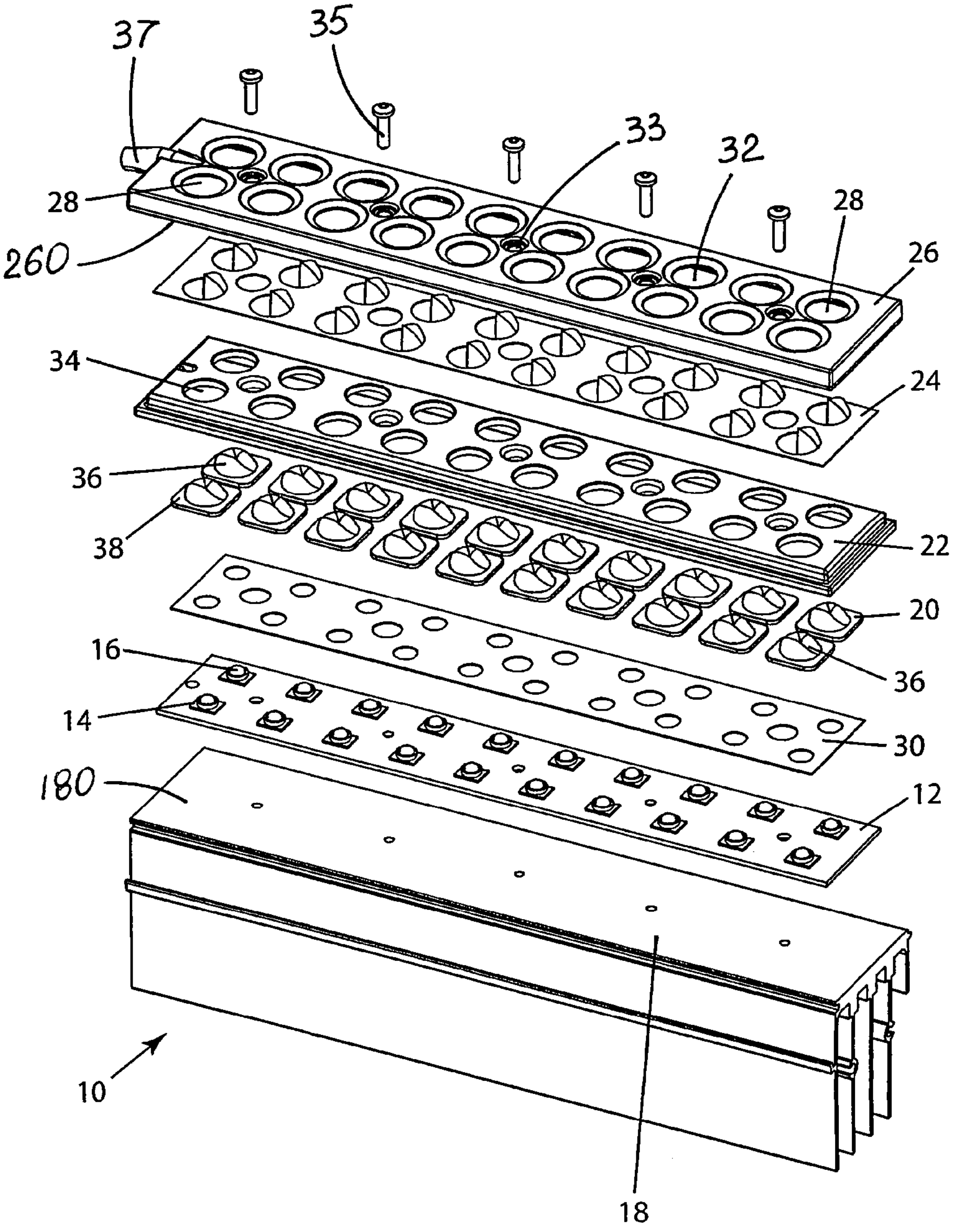
FIG. 1 is an exploded perspective view of an exemplary LED module.
Figure 3:
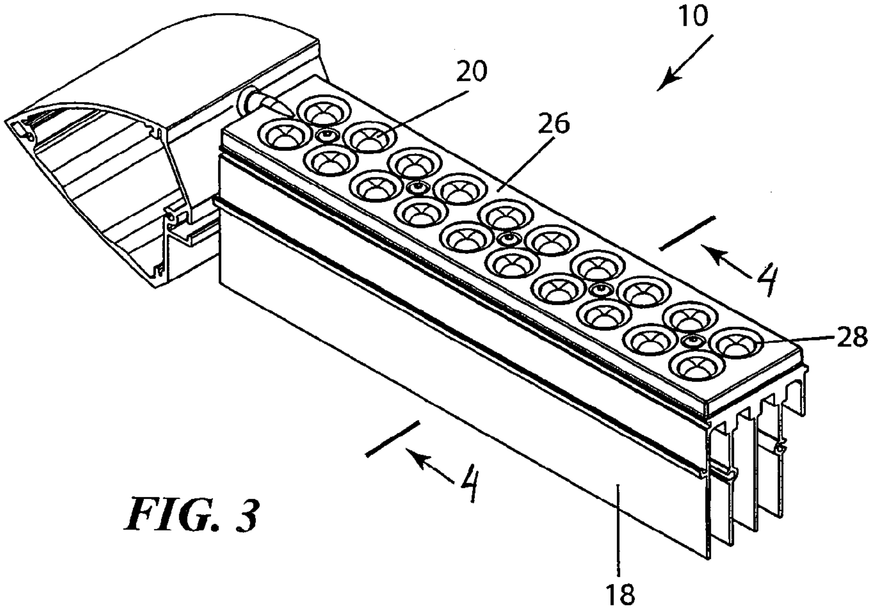
FIG. 3 is a perspective view of a completed LED module.
Figure 4:
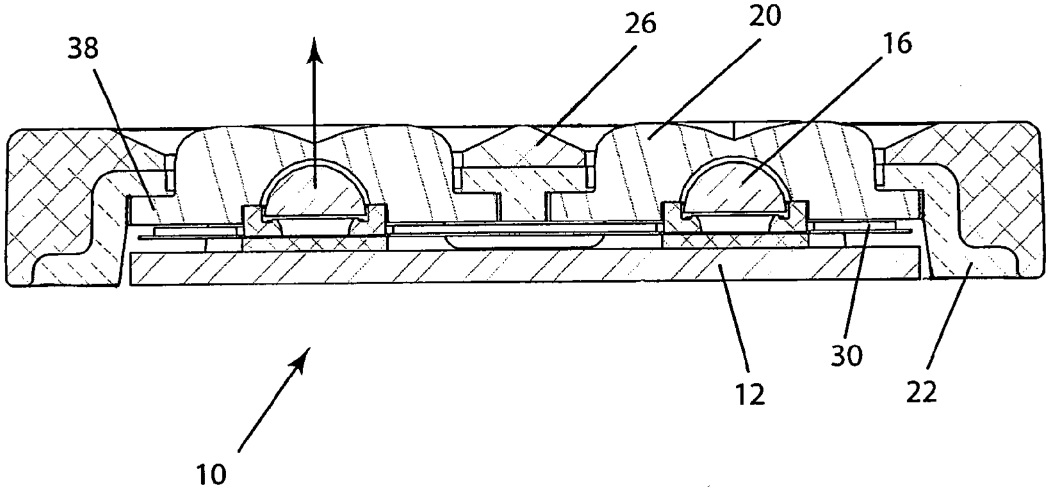
FIG. 4 is a cross-sectional view along lines 4-4 shown in FIG. 3 of the LED module without the base portion.

FIGS. 1, 3 and 4 illustrate an LED module 10 which includes a mounting board 12 with a plurality of LED emitters 14 thereon. Illustrated LED emitters 14 include primary lenses 16. A secondary LED lens 20 is positioned over each emitter 13. Mounting board 12 is connected to a base portion which is shown as a heat sink 18. One or more LED modules 10 may be used as light sources in various LED lighting fixtures. LED module 10 includes a sealing device shown in the form of a resilient member 22 against which LED lenses 20 are positioned. Resilient member 22 yieldingly constrains secondary lenses 20 and accommodates the movement of secondary lenses 20 caused by thermal expansion during LED operation. Such expansion is mostly caused by primary lenses 16 in the embodiment shown in FIGS. 1 and 4.

FIGS. 1 and 4 show resilient member 22 in the form of a gasket layer between a cover 26 and mounting board 12. Gasket 22 has a plurality of gasket apertures 34 and is preferably made from closed-cell silicone which is soft or non-porous solid silicone material. Alternatively, resilient member 22 may be made from any suitable material which may be tailored for the desired LED-module use.

LED lens 20 includes a lens portion (or "light-transmission portion") 36 which is substantially transparent and a flange portion 38 which extends about lens portion 36. Lens portion 36 is adjacent to flange portion 38, as illustrated in FIG. 1. Flange portion 38 is planar and has outer and inner surfaces. Resilient member 22 includes an inner surface which faces and yieldingly abuts flange 38. As seen in FIG. 1, resilient member 22 is sandwiched between cover 26 and flanges 38 of lenses 20, causing outer surface of flange portion 38 to abut the inner surface of resilient member 22.

Thermal expansion of primary lenses 16 may cause in undesirable abutment of primary and secondary lenses. Resilient member 22 permits displacement of secondary lenses 20 while holding secondary lenses 20 in place over primary lenses 16.

As best seen in FIG. 4, in assembled LED module 10, secondary lenses 20 are in close proximity to primary lenses 16. Separate and discrete secondary lenses 20 are each provided over each LED emitter 14. However, persons skilled in the art will appreciate that plural secondary lenses 20 can be made as a single piece with their flange portions formed together.

Cover 26 has an inner surface 260 and base portion 18 has an inner surface 180. Inner surfaces 260 and 180 together define an interior 32. Cover 26 has openings 28 each aligned with a corresponding LED emitter 14. Cover 26 further includes screw holes 33 for use with screws 35 for securing base portion 18 with respect to cover 26. Cover 26 also includes a power connection which is shown as a wireway opening 37. As seen in FIG. 3, wireway opening 37 allows passage of wires (not shown) from a lighting fixture to LED module 10 for powering LED emitters 14.

FIG. 1 further shows a shield member 24, in the form of a layer. Shield member 24 is shown to be placed into interior 32 such that it is sandwiched between cover 26 and resilient member 22.

LED apparatus 10 further includes a metal layer 30, preferably of aluminum. Layer 30 is positioned into module interior 32 to cover electrical connections on mounting board 12 with LED emitters 14. Layer 30 includes a plurality of openings each aligned with corresponding lens 20 and permitting light passage of corresponding LED emitter 14 therethrough. The openings in layer 30 are sized to receive a corresponding primary lens 16 therethrough. FIGS. 1 and 4 show layer 30 sandwiched between mounting board 12 and secondary lens 20. Metal layer 30 is herein referred to as safety barrier 30, the details of which are described in detail in the above-referenced U.S. patent application Ser. No. 11/774,422.

It should be appreciated that some versions of LED module 10 can include only one LED emitter 14 on mounting board 12, a corresponding lens 20 and a resilient member 22 against lens 20.

LED module 10 is assembled in a series of steps. In preferred example of the inventive method, cover 26 is placed such that its inner surface 260 is facing up. Shield member 24 is then positioned into interior 32 such that each shield projection is aligned with a corresponding cover opening 28. Then resilient member 22 is put into interior 32 with apertures 34 aligned with cover openings 28.

Various automated devices perform placing and verifying steps through testing or reading parts of LED module 10.

Figure 2:
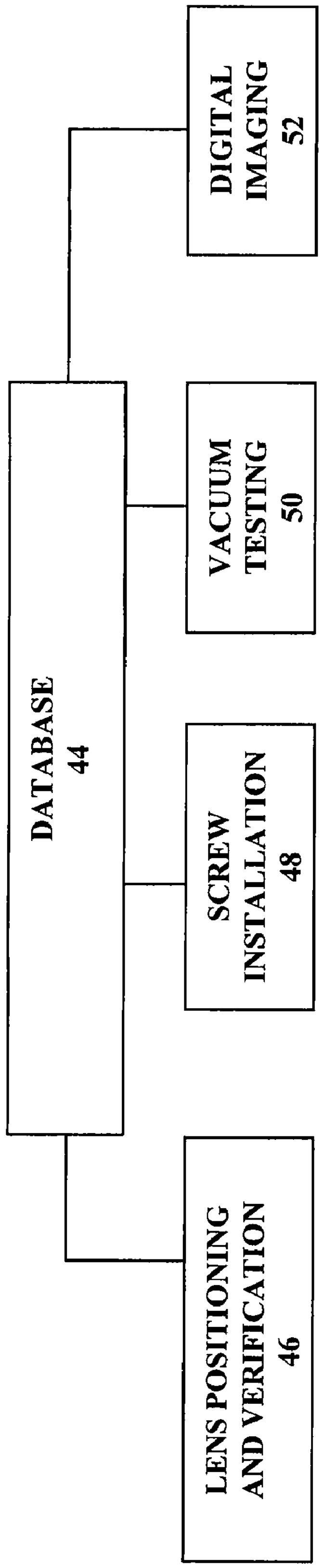
FIG. 2 is a schematic illustration of the components of LED module production process.

As schematically shown in FIG. 2, the automated devices are all interconnected with a central controller including a database 44. Specific types of data are sent from database 44 to these automated devices to instruct each device regarding operational parameters. On the other hand, data from each device is sent to database 44 for storage and quality assurance. An SQL (Structured Query Language) database system may be utilized to control and record all testing parameters and results.

Figure 5:
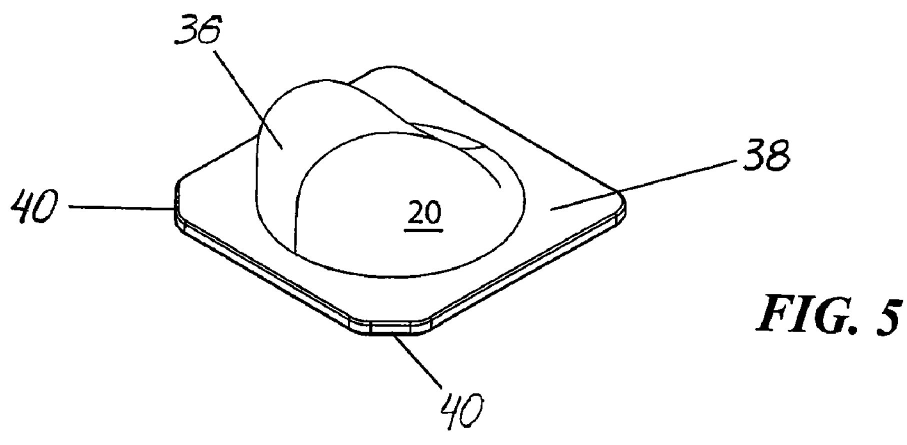
FIG. 5 is an enlarged perspective view from light-output side of an example of a secondary LED lens.
Figure 6:
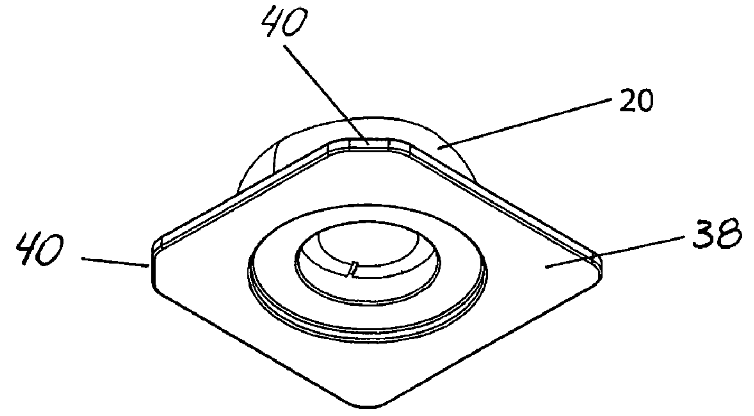
FIG. 6 is an enlarged perspective view from an emitter-receiving side of the LED lens of FIG. 5.
Figure 7:
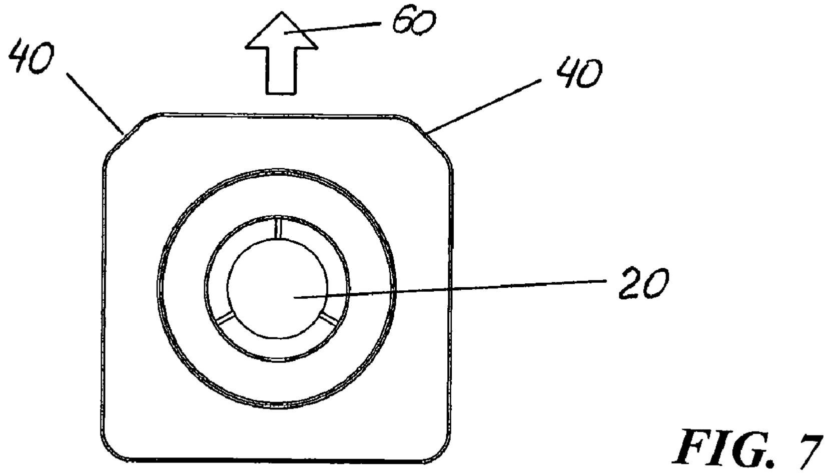
FIG. 7 is an enlarged emitter-receiving side plan elevation of the LED lens of FIG. 5.

As seen in FIG. 2, the inventive assembly method includes a step 46 of positioning and verification of lens 20. Step 46 is preferably preformed by a robot. For example, an ABB IRB340 FlexPicker Robot with IRC5 Controller can be utilized. In LED modules 10 for certain applications with specific illumination-distribution requirements, it is desirable to use a variety of different types of secondary lenses 20 to achieve such required illumination distribution. When a plurality of modules are assembled, each module may require different lenses 20 placed in different locations and in different orientations. Data related to a specific lens 20 to be utilized is received by the robot from database 44 and identified lenses 20 are placed into interior 32. Each lens 20 is then verified to be the correct type of lens 20 and to be positioned in specified orientation. For such identification and verification, lens 20 may include a machine-identifiable lens-indicia which can be in a form of a bar code, text or a specific shape 40 which indicates a specified orientation 60, as shown in FIGS. 5-7. One example of automated devices used for step 46 is a Cognex Insight 5603 Digital Vision Camera which is associated with the FlexPicker Robot. After the lens 20 is put into place, the camera can read the indicia. The data from such reading is sent back to database 44 for storage.

Next, layer 30 and mounting board 12 are placed over the cover 26. LED emitters 14 on mounting board 12 are aligned with corresponding secondary lenses 20. Finally, the heat sink 18 is secured to cover 26 to close interior 32.

The step of screw installation 48 is then performed to seal interior 32 of LED module 10. It is preferred that a transducerized electronic screwdriver with parametric control be utilized. For example, a Chicago Pneumatic Techmotive SD25 Series electric screwdriver with CS2700 controller is capable of performing this step. Data related to the amount of torque to be utilized is received by the screwdriver from database 44. In screw-installation step 48, initially all the screws 35 but one are put into screw holes 33. Data related to the actual torque applied to secure screws 35 is then sent to database 44 for storage.

One remaining screw hole 33 is used for vacuum testing 50 of LED module 10 to ensure water/air-tight seal of interior 32. One example of a vacuum testing apparatus is a Uson Sprint IQ Multi-Function Leak & Flow Tester which can be utilized in vacuum-testing step 50. In step 50, wireway opening 37 is temporarily sealed and a vacuum is applied via the open screw hole 33. The vacuum is applied according to data from database 44. Actual vacuum-test results are sent back to database 44 for storage. After vacuum testing 50, final screw 35 is secured in same manner as described above.

The final step of the LED-module verification is a digital imaging 52 of LED module 10. For digital-imaging step 52, power is provided to LED module 10 to energize LED emitters 14. The imaging and analysis of LED module 10 are done through an automated system. One example of such system is a National Instruments Digital Vision Camera utilizing LabView Developer Suite software which can be utilized to complete digital-imaging step 52. A digital image of powered LED module 10 is taken. From this image the software can analyze light output, color characteristics, intensity and light distribution. Data related to these parameters are then sent to database 44 for storage.

Figures 8, 9:
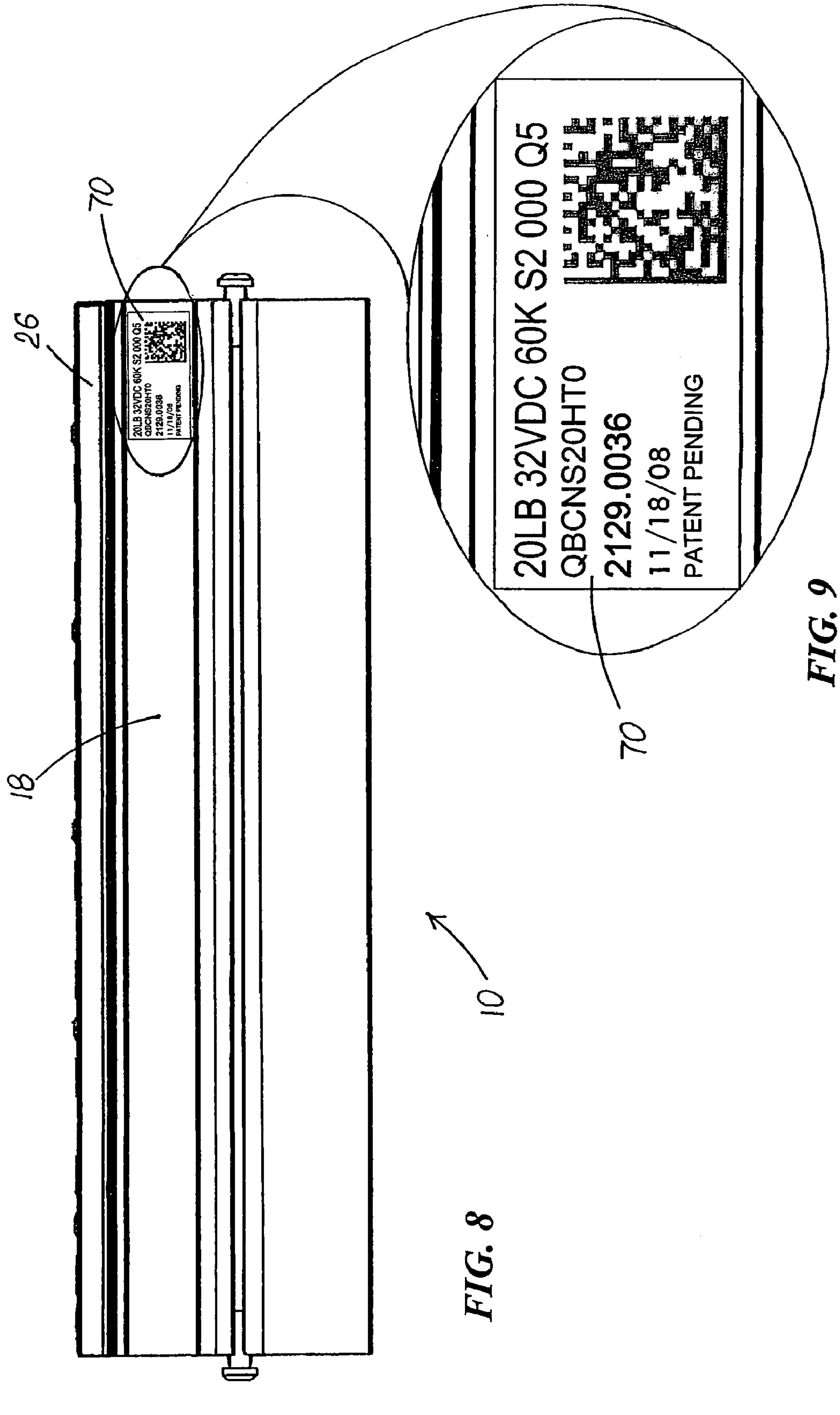
FIG. 8 is a side plan elevation of the LED module with a unique machine-identifiable module-marking.
FIG. 9 is an enlarged view of the unique machine-identifiable module-marking of FIG. 8.

Through the described inventive method, individual results can be tracked in a mass-production setting. In such mass-production setting, each individual LED module 10 can include a unique machine-identifiable module-marking 70 which is shown in FIGS. 8 and 9 as a combination of a text with a set of symbols and a bar code. Data related to each individual LED module 10 from each automated step (lens placement and verification 46, screw installation 48, vacuum testing 50 and digital imaging 52) is then associated in database 44 with the unique machine-identifiable module-marking 70.

While the principles of this invention have been described in connection with specific embodiments, it should be understood clearly that these descriptions are made only by way of example and are not intended to limit the scope of the invention.

The invention claimed is:

1. A method for LED-module assembly comprising the steps of:

providing a base portion with a base inner surface and a cover with a cover inner surface which together define a module interior, the cover having at least one opening therethrough and a plurality of screw holes;

putting a sealing member into the module interior;

positioning an LED lens into the cover opening;

aligning an LED emitter and the LED lens within the module interior;

sealing the module interior by inserting a screw into each but one of the screw holes to secure the base portion with respect to the cover;

vacuum testing for water-air/tightness of the sealing of LED-module interior;

powering the LED emitter; and imaging the LED module to test light-output characteristics.

2. The method of claim 1 wherein:

the cover includes a plurality of openings;

a specific type of the LED lens is placed into each opening; and the aligning step includes a plurality of LED emitters on a mounting board, each emitter being aligned with a corresponding LED lens.

3. The method of claim 1 further including the steps of:
selecting a specific type of the LED lens; and
verifying the LED-lens type and its orientation.

4. The method of claim 3 wherein the steps of positioning and verifying of the lens are performed by a robot incorporating a vision system.

5. The method of claim 4 wherein:
the LED lens includes a machine-identifiable lens-indicia; and
the verifying step is accomplished by the vision system reading the machine-identifiable lens-indicia.

6. The method of claim 1 wherein the step of inserting screws is performed by an automated screwdriver capable of controlling the torque utilized during the insertion.

7. The method of claim 1 wherein the cover further includes a power connection.

8. The method of claim 7 wherein:
the power connection is in a form of a wireway opening; and
prior to the vacuum-testing, the sealing of the interior includes the step of sealing the wireway opening.

9. The method of claim 1 wherein the vacuum-testing step utilizes the screw hole without a screw therein as an access point for vacuum testing.

10. The method of claim 1 further including the step of providing a central database providing assembly and testing parameters.

11. The method of claim 10 being performed by an automated system receiving instructions from the central database for each particular step preformed by automated tool(s) from which the central database collects and stores data related to the lens, vacuum-testing parameters and light-output characteristics.

12. The method of claim 11 wherein:
the LED module includes a unique machine-identifiable module-marking;
a set of the method steps is repeated multiple times to create a plurality of LED modules; and
the method further includes the step of reading the unique machine-identifiable module-marking;
whereby the data related to the lens, vacuum-testing parameters and light-output characteristics of each individual LED module is associated with the unique machine-identifiable module-marking.

13. The method of claim 1 further including the step of providing a central database providing assembly and testing parameters.

14. The method of claim 13 whereby the central database collects and stores data related to the LED lens and light-output characteristics.

15. The method of claim 14 wherein:
the LED module includes a unique machine-identifiable module-marking;
the method is repeated multiple times to create a plurality of LED modules; and
the method further includes the step of reading the unique machine-identifiable module-marking,
whereby the data related to the lens and light-output characteristics of an individual LED module is associated with the unique machine-identifiable module-marking.

16. The method of claim 1 wherein the base portion includes a heat sink.

17. The method of claim 1 wherein the imaging of the LED module is utilized to test intensity, light distribution and color temperature of light from the LED emitter.

18. A method of LED-module assembly comprising the steps of:
providing a base portion with a base inner surface and a cover with a cover inner surface which together define a module interior, the cover having at least one opening therethrough;
placing the cover with its inner surface facing up providing LED-lens gravity retention within the cover opening prior to installing the base portion over the cover;
putting a sealing member over the cover inner surface;
positioning an LED lens into the cover opening;
aligning an LED emitter over the LED lens;
sealing the module interior by installing the base portion over the cover;
vacuum testing the sealing for water/air-tightness of the LED-module interior.

19. A method of LED-module assembly comprising the steps of:
providing a base portion with a base inner surface and a cover with a cover inner surface which together define a module interior, the cover having at least one opening therethrough and a plurality of screw holes;
putting a sealing member into the module interior;
positioning an LED lens into the cover opening;
aligning an LED emitter and the LED lens within the module interior;
sealing the module interior by securing the base portion with respect to the cover by inserting a screw into each but one of the screw holes; and
vacuum testing the sealing for water-air/tightness of the LED-module interior.

20. The method of claim 19 wherein the step of inserting screws is performed by an automated screwdriver capable of controlling the torque utilized during the insertion.

21. The method of claim 19 wherein the vacuum-testing step utilizes the screw hole without a screw therein as an access point for vacuum testing.

22. The method of claim 18 wherein:
the cover includes a plurality of screw holes; and
prior to the vacuum-testing step, the sealing of the interior includes the step of inserting a screw into each but one of the screw holes.

23. The method of claim 22 wherein the step of inserting screws is performed by an automated screwdriver capable of controlling the torque utilized during the insertion.

24. The method of claim 18 wherein the vacuum-testing step utilizes the screw hole without a screw therein as an access point for vacuum testing.

* * * * *